United States Patent
Chanana et al.

(10) Patent No.: US 10,515,684 B2
(45) Date of Patent: Dec. 24, 2019

(54) READ ASSIST CIRCUITRY FOR MEMORY APPLICATIONS

(71) Applicant: Arm Limited, Cambridge (GB)

(72) Inventors: Mohit Chanana, New Delhi (IN); Ankur Goel, Noida (IN); Shruti Aggarwal, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/823,490

(22) Filed: Nov. 27, 2017

(65) Prior Publication Data

US 2019/0164590 A1 May 30, 2019

(51) Int. Cl.
| | |
|---|---|
| *G11C 11/413* | (2006.01) |
| *G11C 11/408* | (2006.01) |
| *G11C 11/418* | (2006.01) |
| *G11C 11/419* | (2006.01) |
| *G11C 8/08* | (2006.01) |

(52) U.S. Cl.
CPC ............ *G11C 11/4085* (2013.01); *G11C 8/08* (2013.01); *G11C 11/4087* (2013.01); *G11C 11/418* (2013.01); *G11C 11/419* (2013.01)

(58) Field of Classification Search
USPC .......................................................... 365/206
See application file for complete search history.

(56) References Cited

U.S. PATENT DOCUMENTS

2013/0128680 A1* 5/2013 Holla .................... G11C 11/413
365/206

* cited by examiner

*Primary Examiner* — Jason Lappas
(74) *Attorney, Agent, or Firm* — Pramudji Law Group PLLC; Ari Pramudji

(57) ABSTRACT

Various implementations described herein are directed to an integrated circuit having a wordline driver coupled to a bitcell via a wordline. The wordline driver may include multiple transistors. The integrated circuit may include a read assist transistor coupled to the wordline between the wordline driver and the bitcell. Gates of the read assist transistor and at least one transistor of the multiple transistors may be coupled together. While activated, the read assist transistor may provide a read assist signal to the wordline when the wordline is selected and driven by the wordline driver.

19 Claims, 5 Drawing Sheets

Table 2

| | Voltage Level | MOS Configuration | | |
|---|---|---|---|---|
| Read Assist Settings | VDDCA | P1 | P2 | Read Assist Level |
| Settings I | 1 | Driver | Driver | No Assist |
| Settings II | 0 | Driver | Bleeder | POR |

Table 1

| Read Assist Settings | Voltage Level | | MOS Configuration | | | Read Assist Level |
| --- | --- | --- | --- | --- | --- | --- |
| | VDDCA1 | VDDCA2 | P1 | P2 | P3 | |
| Settings I | 1 | 1 | Driver | Driver | Driver | No Assist |
| Settings II | 1 | 0 | Driver | Driver | Bleeder | POR |
| Settings III | 0 | 1 | Driver | Bleeder | Driver | Intermediate |
| Settings IV | 0 | 0 | Driver | Bleeder | Bleeder | Highest |

Table 2

200B

| CEN | RAWLM1 | RAWLM0 | VDDCX | VDDCA1 | VDDCA2 |
|---|---|---|---|---|---|
| 1 | X | X | Z | Z | Z |
| 0 | 0 | 0 | High | High | High |
| 0 | 0 | 1 | High | High | Low |
| 0 | 1 | 0 | High | Low | High |
| 0 | 1 | 1 | High | Low | Low |

Table 3

FIG. 2B

READ ASSIST CIRCUITRY FOR MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, in an attempt to inhibit degradation of read and write margins, some memory devices have attempted to support read and write operations by delaying data access signals in the signal path to recover read margins. This delay typically results in a timing penalty for data access. Similarly, in an attempt to recover write margins, some memory devices have attempted to increase an amount of write assist, which typically leads to increased area penalty, power penalty and implementation complexities. Thus, there exists a need to improve integrated circuitry to enable recovery of degraded read and write margins in a more efficient manner.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 2A-2B illustrate a diagram of wordline driver circuitry in accordance with various implementations described herein.

DETAILED DESCRIPTION

Various implementations described herein are directed to read assist circuitry for memory applications, wherein the read assist circuitry may provide for area-aware, low power and a programmable read assist scheme. For instance, various implementations described herein may provide for a read assist scheme and technique having negligible area overhead, lowest dynamic power, race free, and easily programmable schemes for various lowering read assist levels. Various implementations provided herein may provide for some advantages, including low or no area impact, an easily programmable scheme for providing different read assist levels, and improved performance and dynamic power. Further, some other advantages may include race free operating conditions with no need for a timing lock with a global timing signal (GTP), no DC path conditions, and relative robustness toward local processing variations in integrated circuit designs.

Various implementations of read assist circuitry for memory applications will now be described in greater detail herein with reference to FIGS. 1A-3.

Figure 1A:
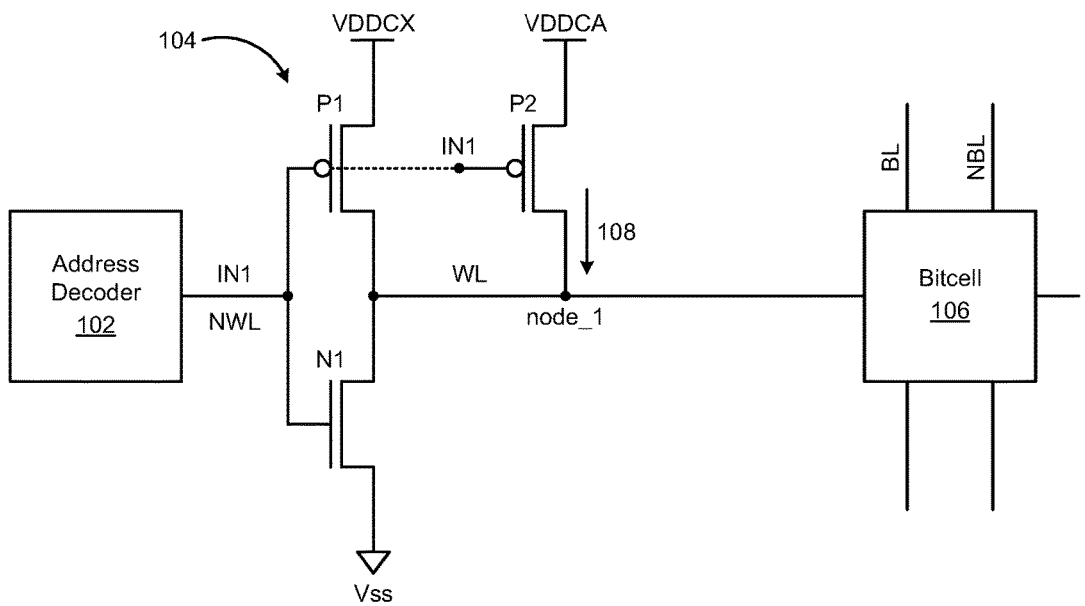
FIGS. 1A-1B illustrate various diagrams of read assist circuitry in accordance with various implementations described herein.
Figure 1B:
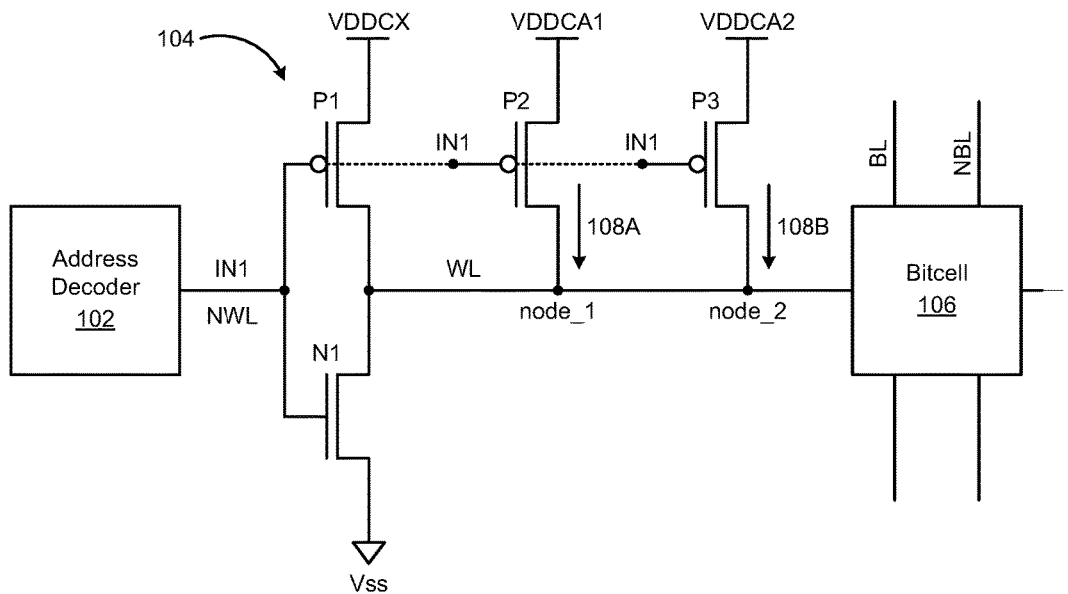

FIGS. 1A-1B illustrate various schematic diagrams of read assist circuitry 100A in accordance with various implementations described herein. In particular, FIG. 1A illustrates a first embodiment of read assist circuitry 100A, and FIG. 1B illustrates a second embodiment of read assist circuitry 100A.

As shown in FIG. 1A, the read assist circuitry 100A may include various other circuitry including an address decoder 102, a wordline driver 104, a read assist transistor P2, and a bitcell 106. The read assist circuitry 100 may include a wordline NWL, WL that is coupled between the address decoder 102 and a corresponding row for access to the bitcell 106 based on a selected wordline. The wordline NWL, WL may be selected by the address decoder 102 with a particular address. The read assist circuitry 100A may be part of memory circuitry, and the bitcell 106 may be part of an array of bitcells, wherein each of the bitcells is accessible via a corresponding wordline. For instance, the bitcell 106 is accessible via wordline NWL, WL when selected with a particular address.

The wordline driver 104 may be coupled to the bitcell 106 via the wordline NWL, WL, and as shown, the wordline driver 104 may include multiple transistors, such as a first transistor P1 and a second transistor N1. As shown, the address decoder 102 may be coupled to each gate of the multiple transistors P1, N1 of the wordline driver 104, and the address decoder 102 may provide an input signal IN1 to each gate of the multiple transistors P1, N1. Further, since the gates of the first transistor P1 and the read assist transistor P2 are coupled together, the address decoder 102 may provide the input signal IN1 to the first transistor P1 and the read assist transistor P2.

The read assist transistor P2 may be coupled to the wordline NWL, WL between the wordline driver 104 and the bitcell 106, such that gates of the read assist transistor P2 and at least one transistor of the multiple transistors (e.g., first transistor P1) are coupled together. In this instance, as shown in FIG. 1A, input IN1 to gates of the first transistor P1 and the read assist transistor P2 are common. Further, while activated, the read assist transistor P2 may provide a read assist signal 108 to the wordline NWL, WL when the wordline NWL, WL is selected and driven by the wordline driver 104.

The multiple transistors of the wordline driver 104 may include the first transistor P1 and the second transistor N1, and as shown in FIG. 1A, the gates of the read assist transistor P2 and the first transistor P1 are coupled together. The first transistor P1 may be a P-type metal-oxide-semiconductor (PMOS) transistor, and the second transistor N1 may be an N-type MOS (NMOS) transistor. Further, the read assist transistor P2 may be a P-type MOS (PMOS) transistor. In some scenarios, a first source voltage VDDCX (e.g., a first core voltage) may be applied to the first transistor P1, and a second source voltage VDDCA (e.g., a second core voltage) may be applied to the read assist transistor P2. The second source voltage VDDCA is different than the first source voltage VDDCX. Further, the source voltages VDDCX, VDDCA may be isolated power supplies.

FIG. 1A includes Table 1, which may refer to a first truth table for the selective activation of the first transistor P1 and the read assist transistor P2. In Table 1, read assist settings I and II may refer to multiple programmable settings for selectively activating the first transistor P1 and the read assist transistor P2. For instance, the programmable read assist settings may include a first setting (i.e., Settings I), wherein at a first source voltage level for VDDCA (e.g., a logical data value of 1), the read assist transistor P2 may operate without providing the read assist signal 108 to the wordline NWL, WL at a first node (i.e., node_1). In this instance of the first setting (i.e., Settings I), the MOS configuration of the transistors P1, P2 provide for the first transistor P1 to operate as a driver device and the read assist transistor P2 to also operate as a driver device so as to provide no read assist functionality to the bitcell 106.

In another instance, the programmable read assist settings may include another second setting (i.e., Settings II), wherein at a second source voltage level for VDDCA (e.g., a logical data value of 0), the read assist transistor P2 may operate to provide the read assist signal 108 to the wordline NWL, WL, such that the read assist transistor P2 may operate as a bleeder transistor to provide a power-on-reset (POR) functionality to the bitcell 106. In this instance of the second setting (i.e., Settings II), the MOS configuration of the transistors P1, P2 provide for the first transistor P1 to operate as a driver device and the read assist transistor P2 to also operate as a bleeder device so as to provide a power-on-reset (POR) functionality to the bitcell 106.

In some implementations, the read assist circuitry 100A of FIG. 1A may be modified to include one or more additional read assist transistors. For instance, as shown in FIG. 1B, the read assist circuitry 100B may include another read assist transistor P3, wherein the transistor P2 may be referred to as a first read assist transistor P2, and the transistor P3 may be referred to as a second read assist transistor P3. In this instance, as shown in FIG. 1B, gates of the first read assist transistor P2, the second read assist transistor P3, and the first transistor P1 are coupled together. I.e., input IN1 to the gates of the first transistor P1, the first read assist transistor P2, and the second read assist transistor P3 are common.

As shown in FIG. 1B, the address decoder 102 may be coupled to each gate of the multiple transistors P1, N1 of the wordline driver 104, and the address decoder 102 may provide an input signal IN1 to each gate of the multiple transistors P1, N1. Further, since the gates of the first transistor P1, the first read assist transistor P2, and the second read assist transistor P3 are coupled together, the address decoder 102 may provide the input signal IN1 to the first transistor P1, the first read assist transistor P2, and the second read assist transistor P3.

In some implementations, the first transistor P1 may be a P-type MOS (PMOS) transistor, the second transistor N1 may be an N-type MOS (NMOS) transistor. Further, the first read assist transistor P2 may be a PMOS transistor, and the second read assist transistor P3 may be a PMOS transistor.

A first source voltage VDDCX may be applied to the first transistor P1, a second source voltage VDDCA1 may be applied to the first read assist transistor P2, and a third source voltage VDDCA2 may be applied to the second read assist transistor P3. The second source voltage VDDCA1 and the third source voltage VDDCA2 may be different than the first source voltage VDDCX, and the third source voltage VDDCA2 may be different than the second source voltage VDDCA1. Further, the source voltages VDDCX, VDDCA1, VDDCA2 may be isolated power supplies.

In FIG. 1B, the read assist circuitry 100B provides multiple read assist signals including a first read assist signal 108A at the first node (i.e., node_1) and a second read assist signal 108B at a second node (i.e., node_2). For instance, while activated, the first read assist transistor P2 may provide the first read assist signal 108A to the wordline NWL, WL at node_1 when the wordline NWL, WL is selected and driven by the wordline driver 104. In another instance, while activated, the second read assist transistor P3 may provide the second read assist signal 108B to the wordline NWL, WL at node_2 when the wordline NWL, WL is selected and driven by the wordline driver 104.

FIG. 1B includes Table 2, which refers to a second truth table for the selective activation of the first transistor P1, the first read assist transistor P2, and the second read assist transistor P3. In Table 2, the read assist settings I, II, III, and IV may refer to multiple programmable settings for selectively activating the first transistor P1, the first read assist transistor P2, and the second read assist transistor P3. As shown in Table 2, with each different read assist setting I, II, III, and IV, the first read assist transistor P2 and the second read assist transistor P3 may operate in parallel to provide various read assist levels.

For instance, the programmable read assist settings may include a first setting (i.e., Settings I), wherein the first transistor P1 and the first and second read assist transistors P2, P3 may operate in parallel to provide a first read assist level (e.g., No Assist). For instance, at the first source voltage level for VDDCA1 (e.g., logical data value of 1), the first read assist transistor P2 may operate without providing the first read assist signal 108A to the wordline NWL, WL at the first node (i.e., node_1). Also, in this instance, at the first source voltage level for VDDCA2 (e.g., a logical data value of 1), the second read assist transistor P3 may operate without providing the second read assist signal 108B to the wordline NWL, WL at a second node (i.e., node_2). In this instance of the first setting (i.e., Settings I), the MOS configuration of transistors P1, P2, P3 provide for the first transistor P1 to operate as a driver device, the first read assist transistor P2 to operate as a driver device, and the second read assist transistor P3 to also operate as a driver device so as to provide no read assist functionality to the bitcell 106.

Also, the programmable read assist settings may include a second setting (i.e., Settings II), wherein the first transistor P1 and the first and second read assist transistors P2, P3 may operate in parallel to provide a second read assist level (e.g., POR). For instance, at the first source voltage level for VDDCA1 (e.g., logical data value of 1), the first read assist transistor P2 may operate without providing the first read assist signal 108A to the wordline NWL, WL at the first node (i.e., node_1). Also, in this instance, at the second source voltage level for VDDCA2 (e.g., logical data value of 0), the second read assist transistor P3 may operate to provide the second read assist signal 108B to the wordline NWL, WL at the second node (i.e., node_2). In this instance of the second setting (i.e., Settings II), the MOS configuration of transistors P1, P2, P3 provide for the first transistor P1 to operate as a driver device, the first read assist transistor P2 to operate as a driver device, and the second read assist transistor P3 to operate as a bleeder device so as to provide a power-on-reset (POR) functionality to the bitcell 106.

Also, in Table 2, the programmable read assist settings may include a third setting (i.e., Settings III), wherein the first transistor P1 and the first and second read assist transistors P2, P3 may operate in parallel to provide a third read assist level (e.g., Intermediate). For instance, at the second source voltage level for VDDCA1 (e.g., logical data value of 0), the first read assist transistor P2 may operate to provide the first read assist signal 108A to the wordline NWL, WL at the first node (i.e., node_1). Also, in this instance, at the first source voltage level for VDDCA2 (e.g., logical data value of 1), the second read assist transistor P3 may operate to provide the second read assist signal 108B to the wordline NWL, WL at the second node (i.e., node_2). In this instance of the third setting (i.e., Settings III), the MOS configuration of transistors P1, P2, P3 provide for the first transistor P1 to operate as a driver device, the first read assist transistor P2 to operate as a bleeder device, and the second read assist transistor P3 to operate as a driver device so as to provide an intermediate read assist functionality to the bitcell 106.

Also, in Table 2, the programmable read assist settings may include a fourth setting (i.e., Settings IV), wherein the first transistor P1 and the first and second read assist transistors P2, P3 may operate in parallel to provide a fourth read assist level (e.g., Highest). For instance, at the second source voltage level for VDDCA1 (e.g., logical data value of 0), the first read assist transistor P2 may operate to provide the first read assist signal 108A to the wordline NWL, WL at the first node (i.e., node_1). Also, in this instance, at the second source voltage level for VDDCA2 (e.g., logical data value of 0), the second read assist transistor P3 may operate to provide the second read assist signal 108B to the wordline NWL, WL at the second node (i.e., node_2). In this instance of the fourth setting (i.e., Settings IV), the MOS configuration of transistors P1, P2, P3 provide for the first transistor P1 to operate as a driver device, the first read assist transistor P2 to operate as a bleeder device, and the second read assist transistor P3 to operate as a bleeder device so as to provide a high (or highest) read assist functionality to the bitcell 106.

In various implementations, the read assist circuitry 100B of FIG. 1B may be further modified to include one or more additional read assist transistors so as to provide one or more additional programmable read assist settings for each read assist transistor that is added. In these implementations, the read assist settings may be selectively used to effectively increase precision control of the read assist signal levels.

The bitcell 106 may be referred to as a memory cell, and the bitcell 106 may be configured to store at least one data bit value (e.g., a data bit value associated with logical '0' or '1'). The bitcell 106 may be implemented with various random access memory (RAM) circuitry, or some other type of volatile type memory. For instance, the bitcell 106 may include a multi-transistor static RAM (SRAM) cell, including various types of SRAM cells, such as, e.g., a 6 T CMOS SRAM and/or any other type of complementary MOS (CMOS) SRAM cells, such as, e.g., 4 T, 8 T, 10 T, or more transistors per bit.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In various scenarios, high-density SRAM bitcells that are implemented with minimally sized transistors may limit Vmin of a design. However, in FinFET technology, device sizing quantization may remain a challenge for compact 6 T SRAM bitcells with minimum-size transistors. Thus, in some implementations, careful optimization of design memory assist circuits may be used to deliver low power memory operation. As shown, the bitcell 106 may be accessed with the wordline NWL, WL and complementary bitlines BL, NBL.

The various read assist circuitry 100A, 100B including the bitcell 1006 may be implemented as an integrated circuit (IC) with various types of memory circuitry, such as, e.g., RAM and/or other types of memory, including any type of volatile memory and non-volatile memory. The read assist circuitry 100A, 100B may be implemented as an IC with single and/or dual rail memory architectures. The read assist circuitry 100A, 100B may be integrated with computing circuitry and related components on a single chip. Further, the read assist circuitry 100A, 100B may be implemented in an embedded system for various types of electronic, mobile, and/or biometric applications.

Figure 2A:
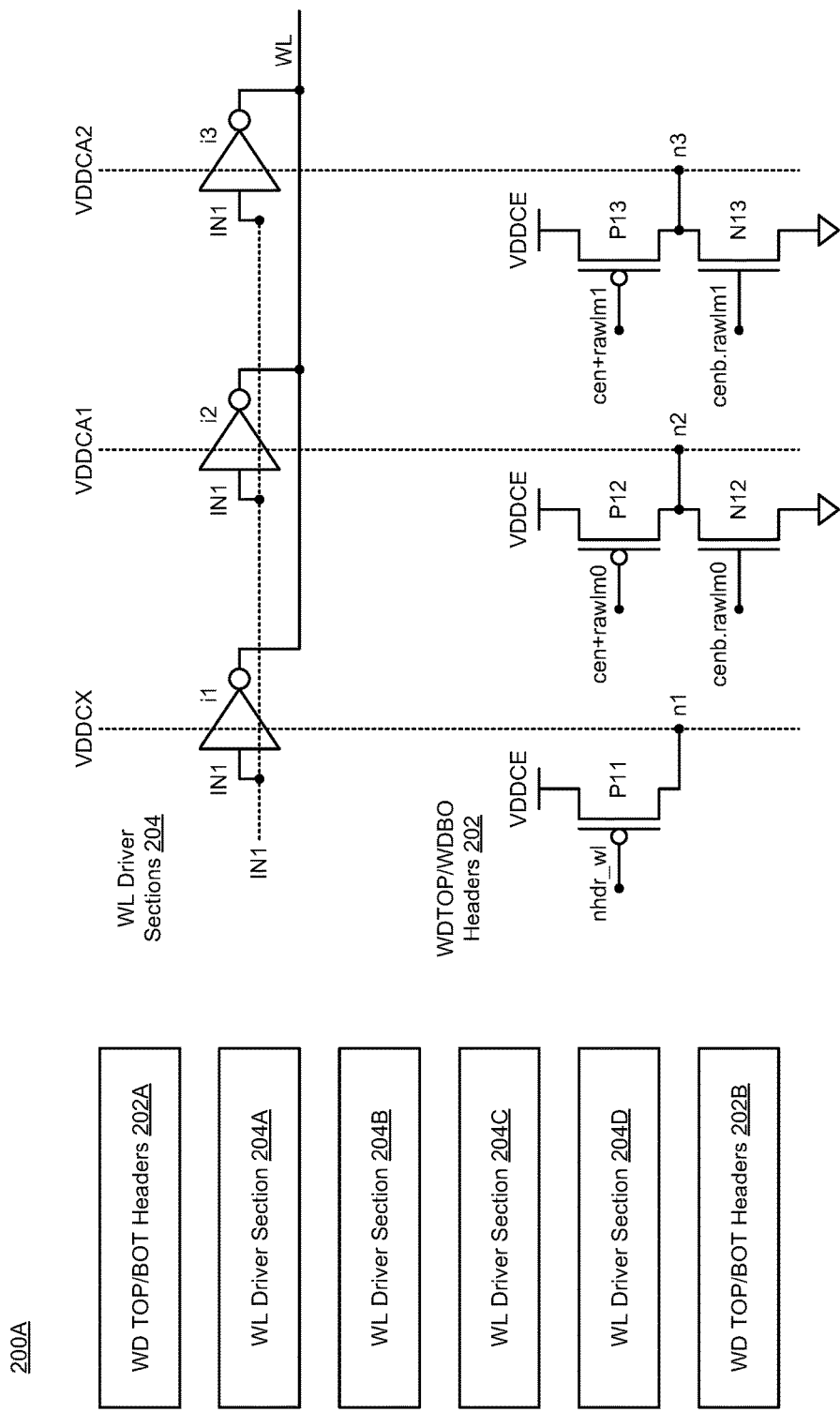

FIGS. 2A-2B illustrate a diagram of wordline driver circuitry in accordance with various implementations described herein. In particular, FIG. 2A illustrates a schematic diagram of wordline driver circuitry 200A, and FIG. 2B illustrates a truth table 200B for various operations of the wordline driver circuitry 200A of FIG. 2A.

As shown in FIG. 2A, the wordline driver circuitry 200A may include multiple wordline driver headers 202A, 202B and multiple wordline driver sections 204A, 204B, 204C, 204D. The multiple wordline driver headers 202A, 202B may include a top wordline driver header 202A (i.e., WDTOP Header) and a bottom wordline driver header 202B (i.e., WDBOT Header). The multiple wordline driver sections 204A, 204B, 204C, 204D may include a first wordline driver section 204A, a second wordline driver section 204B, a third wordline driver section 204C, and a fourth wordline driver section 204D.

In FIG. 2A, the wordline driver headers 202A, 202B may be implemented with WDTOP/WDBOT Header circuitry 202. The WDTOP/WDBOT Header circuitry 202 may include PMOS transistor P11 coupled between a core voltage VDDCE and the first source voltage VDDCX at node n1. The PMOS transistor P11 may receive activation signal nhdr_w1 at a gate thereof.

The WDTOP/WDBOT Header circuitry 202 may include PMOS transistor P12 and NMOS transistor N12 coupled in series between the core voltage VDDCE and ground (VSS or GND). The transistors P12, N12 are coupled to the second source voltage VDDCA1 at a node n2 that is disposed between the transistors P12, N12. The PMOS transistor P12 may receive activation signal cen+rawlm0 at a gate thereof, and the NMOS transistor N12 may receive activation signal cenb.rawlm0 at a gate thereof.

The WDTOP/WDBOT Header circuitry 202 may include PMOS transistor P13 and NMOS transistor N13 coupled in series between the core voltage VDDCE and ground (VSS or GND). The transistors P13, N13 are coupled to the third source voltage VDDCA2 at a node n3 that is disposed between the transistors P13, N13. The PMOS transistor P13 may receive activation signal cen+rawlm1 at a gate thereof, and the NMOS transistor N13 may receive activation signal cenb.rawlm1 at a gate thereof.

In FIG. 2A, the multiple wordline drivers 204A, 204B, 204C, 204D may be implemented with WL Driver Section circuitry 204. The WL Driver Section circuitry 204 may include a first wordline driver i1 coupled to the first source voltage VDDCX. The first wordline driver i1 receives the input signal IN1 and outputs an inverted input signal to the wordline WL based on the input signal IN1 and the first source voltage VDDCX. The WL Driver Section circuitry 204 may include a second wordline driver i2 coupled to the second source voltage VDDCA1. The second wordline driver i2 receives the input signal IN1 and outputs an inverted input signal to the wordline WL based on the input signal IN1 and the second source voltage VDDCA1. The WL Driver Section circuitry 204 may include a third wordline driver i3 coupled to the third source voltage VDDCA2. The third wordline driver i3 receives the input signal IN1 and outputs an inverted input signal to the wordline WL based on the input signal IN1 and the third source voltage VDDCA2.

FIG. 2B illustrates the truth table 200B for various operations of the wordline driver circuitry 200A of FIG. 2A. In Table 3 of FIG. 2B, when CEN is high (e.g., logical data value of 1), RAWLM1 and RAWLM0 are not active (X), the source voltage signals VDDCX, VDDCA1 and VDDCA2 are in a high impedance state (Z). When CEN, RAWLM1 and RAWLM0 are low (e.g., logical data value of 0), the source voltage signals VDDCX, VDDCA1 and VDDCA2 are in a high state. When CEN and RAWLM1 are low (e.g., logical data value of 0) and RAWLM0 is high (e.g., logical data value of 1), the source voltage signals VDDCX and VDDCA1 are in a high state, and VDDCA2 is in a low state. When CEN and RAWLM0 are low (e.g., logical data value of 0) and RAWLM1 is high (e.g., logical data value of 1), the source voltage signals VDDCX and VDDCA2 are in a high state, and VDDCA1 is in a low state. When CEN is low (e.g., logical data value of 0) and RAWLM1 and RAWLM0 is high (e.g., logical data value of 1), the source voltage signal VDDCX is in a high state, and VDDCA1 and VDDCA2 are in a low state.

Various implementations provided herein may provide for some advantages including one or more of the following. For instance, there is no race condition, wherein VDDCA1 and VDDCA2 may be static depending on read assist conditions. Mixing with GTP is not necessary. There is negligible area overhead, which may allow read assist as a standard option feature in some memory architectures. Dynamic power penalty may be less when compared to conventional schemes. Use of a PMOS transistor in the wordline driver for bleeder may ensure robustness toward any process variation. IR drop may be similar or equal for the driver and/or bleeder so as to provide improved matching between top/bottom/middle WL. Extended read assist levels may be easily achieved. Drivers may need to be split as per the granularity needed for read assist levels.

Figure 3:
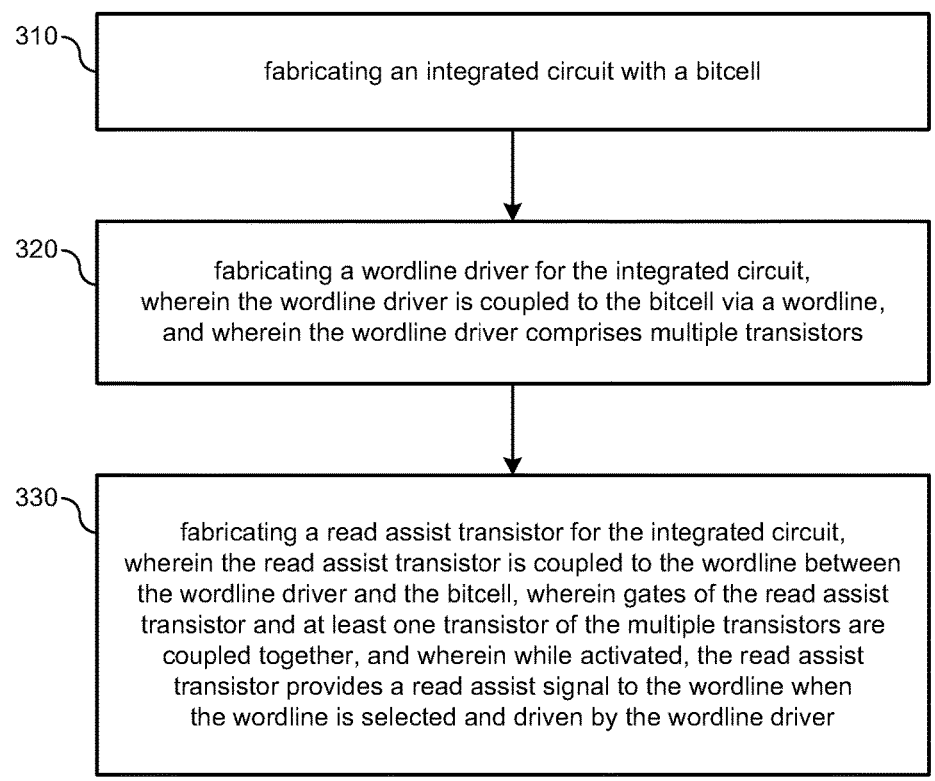
FIG. 3 illustrates a process flow of a method of fabricating read assist circuitry in accordance with various implementations described herein.

FIG. 3 illustrates a process flow of a method 300 for fabricating read assist circuitry in accordance with various implementations described herein.

It should be understood that even though method 300 may indicate a particular order of operation execution, in some cases, various certain portions of the operations may be executed in a different order, and on different systems. In other cases, additional operations and/or steps may be added to and/or omitted from method 300. Further, method 300 may be implemented in hardware and/or software. If implemented in hardware, the method 300 may be implemented with various circuit components, such as described herein above in reference to FIGS. 1A-2B. If implemented in software, the method 300 may be implemented as a program or software instruction process that may be configured for read assist circuitry as described herein. Further, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be utilized for manufacturing an integrated circuit (IC) that implements read assist circuitry in various types of memory applications. For instance, as described herein, method 300 may be utilized for manufacturing read assist circuitry for memory applications, wherein the read assist circuitry may be programmable.

At block 310, method 300 may fabricate an integrated circuit with a bitcell. In some scenarios, the integrated circuit may include memory circuitry having an array of bitcells, and the bitcell may be part of the array of bitcells. The bitcell may be referred to as a memory cell, and the bitcell may be implemented with various types of SRAM cells, such as, e.g., 6 T CMOS SRAM and/or any other type of complementary MOS (CMOS) SRAM cells, such as, e.g., 4 T, 8 T, 10 T, or more transistors per bit.

At block 320, method 300 may fabricate a wordline driver for the integrated circuit. The wordline driver may be coupled to the bitcell via a wordline, and the wordline driver may include multiple transistors. The multiple transistors of the wordline driver may be arranged as an inverter or buffer.

At block 330, method 300 may fabricate a read assist transistor for the integrated circuit. The read assist transistor may coupled to the wordline between the wordline driver and the bitcell, such that gates of the read assist transistor and at least one transistor of the multiple transistors are coupled together. Further, while activated, the read assist transistor may provide a read assist signal to the wordline when the wordline is selected and driven by the wordline driver.

Described herein are various implementations of an integrated circuit. The integrated circuit may include a wordline driver coupled to a bitcell via a wordline. The wordline driver may include multiple transistors. The integrated circuit may include a read assist transistor coupled to the wordline between the wordline driver and the bitcell. Gates of the read assist transistor and at least one transistor of the multiple transistors may be coupled together. While activated, the read assist transistor may provide a read assist signal to the wordline when the wordline is selected and driven by the wordline driver.

Described herein are various implementations of an integrated circuit. The integrated circuit may include a wordline driver coupled to a bitcell via a wordline. The wordline driver may include a first p-type transistor and an n-type transistor. The integrated circuit may include a second p-type transistor coupled to the wordline between the wordline driver and the bitcell. Gates of the first p-type transistor and the second p-type transistor may be coupled together. While activated, the second p-type transistor may provide a read assist signal to the wordline when the wordline is selected and driven by the wordline driver.

Described herein are various implementations of a method for manufacturing an integrated circuit. The method may include fabricating a wordline driver coupled to a bitcell via a wordline, and the wordline driver may include multiple transistors. The method may include fabricating a read assist transistor coupled to the wordline between the wordline driver and the bitcell. Gates of the read assist transistor and at least one transistor of the multiple transistors may be coupled together. While activated, the read assist transistor may provide a read assist signal to the wordline when the wordline is selected and driven by the wordline driver.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a wordline driver coupled to a bitcell via a wordline, wherein the wordline driver comprises multiple transistors; and
a read assist transistor coupled to the wordline between the wordline driver and the bitcell, wherein gates of the read assist transistor and at least one transistor of the multiple transistors are coupled together, wherein while activated, the read assist transistor provides a read assist signal to the wordline when the wordline is selected and driven by the wordline driver,
wherein the multiple transistors of the wordline driver comprise a first transistor and a second transistor, and wherein the first transistor comprises the at least one transistor of the multiple transistors, and wherein gates of the read assist transistor and the first transistor are coupled together, and
wherein a first source voltage is applied to the first transistor, wherein a second source voltage is applied to the read assist transistor, and wherein the second source voltage is different than the first source voltage.

2. The integrated circuit of claim 1, wherein the first transistor comprises a P-type metal-oxide-semiconductor (PMOS) transistor, wherein the second transistor comprises an N-type MOS (NMOS) transistor, and wherein the read assist transistor comprises a PMOS transistor.

3. The integrated circuit of claim 1, wherein at a first source voltage level, the read assist transistor operates without providing the read assist signal to the wordline, and wherein at a second source voltage level, the read assist transistor operates to provide the read assist signal to the wordline such that the read assist transistor operates as a bleeder transistor to provide a power-on-reset (POR) functionality to the bitcell.

4. An integrated circuit, comprising:
a wordline driver coupled to a bitcell via a wordline, wherein the wordline driver comprises multiple transistors; and
a read assist transistor coupled to the wordline between the wordline driver and the bitcell, wherein gates of the read assist transistor and at least one transistor of the multiple transistors are coupled together, and wherein while activated, the read assist transistor provides a read assist signal to the wordline when the wordline is selected and driven by the wordline driver,
wherein the multiple transistors of the wordline driver comprise a first transistor and a second transistor, and wherein the first transistor comprises the at least one transistor of the multiple transistors, and wherein the read assist transistor comprises multiple read assist transistors including a first read assist transistor and a second read assist transistor, and wherein gates of the first read assist transistor, the second read assist transistor, and the first transistor are coupled together.

5. The integrated circuit of claim 4, wherein a first source voltage is applied to the first transistor, wherein a second source voltage is applied to the first read assist transistor, wherein a third source voltage is applied to the second read assist transistor, wherein the second source voltage and the third source voltage are different than the first source voltage, and wherein the third source voltage is different than the second source voltage.

6. The integrated circuit of claim 5, wherein the first transistor comprises a P-type metal-oxide-semiconductor (PMOS) transistor, wherein the second transistor comprises an N-type MOS (NMOS) transistor, wherein the first read assist transistor comprises a PMOS transistor, and wherein the second read assist transistor comprises a PMOS transistor.

7. The integrated circuit of claim 4, wherein the read assist signal comprises multiple read assist signals including a first read assist signal and a second read assist signal, and wherein while activated, the first read assist transistor provides the first read assist signal to the wordline when the wordline is selected and driven by the wordline driver, and wherein while activated, the second read assist transistor provides the second read assist signal to the wordline when the wordline is selected and driven by the wordline driver.

8. The integrated circuit of claim 7, wherein at a first source voltage level, the first read assist transistor and the second read assist transistor operate without providing the first read assist signal and the second read assist signal to the wordline, respectively, and wherein at a second source voltage level, the first read assist transistor and the second read assist transistor operate to provide the first read assist signal and the second read assist signal to the wordline, respectively, such that the first read assist transistor and the second read assist transistor operate as bleeder transistors to provide a high read assist functionality to the bitcell.

9. The integrated circuit of claim 7, wherein at a first source voltage level, the first read assist transistor operates without providing the first read assist signal to the wordline, and wherein at a second source voltage level, the second read assist transistor operates to provide the second read assist signal to the wordline such that the second read assist transistor operates as bleeder transistor to provide a power-on-reset (POR) functionality to the bitcell.

10. The integrated circuit of claim 7, wherein at a first source voltage level, the second read assist transistor operates without providing the first read assist signal to the wordline, and wherein at a second source voltage level, the first read assist transistor operates to provide the first read assist signal to the wordline such that the first read assist transistor operates as bleeder transistor to provide an intermediate read assist functionality to the bitcell.

11. The integrated circuit of claim 1, further comprising an address decoder coupled to each gate of the multiple transistors of the wordline driver, wherein the address decoder provides an input signal to each gate of the multiple transistors.

12. An integrated circuit, comprising:
a wordline driver coupled to a bitcell via a wordline, wherein the wordline driver comprises multiple transistors; and
a read assist transistor coupled to the wordline between the wordline driver and the bitcell, wherein gates of the read assist transistor and at least one transistor of the multiple transistors are coupled together, and wherein while activated, the read assist transistor provides a read assist signal to the wordline when the wordline is selected and driven by the wordline driver,
wherein a first source voltage is applied to the wordline driver and a second source voltage is applied to the read assist transistor, and wherein the second source voltage is different than the first source voltage.

13. The integrated circuit of claim 12, wherein the multiple transistors comprise a P-type metal-oxide-semiconductor (PMOS) transistor and an N-type MOS (NMOS) transistor.

14. The integrated circuit of claim 13, wherein the read assist transistor comprises multiple read assist transistors including a first read assist transistor and a second read assist transistor.

15. The integrated circuit of claim 14, wherein gates of the first read assist transistor, the second read assist transistor, and at least one of the multiple transistors are connected.

16. The integrated circuit of claim 14, wherein gates of the first read assist transistor, the second read assist transistor, the PMOS transistor, and the NMOS transistor are connected.

17. The integrated circuit of claim 12, further comprising an address decoder coupled to each gate of the multiple transistors of the wordline driver, wherein the address decoder provides an input signal to each gate of the multiple transistors.

18. The integrated circuit of claim 17, wherein the address decoder further provides an input signal to the read assist transistor.

19. The integrated circuit of claim 14, further comprising an address decoder coupled to each gate of the multiple transistors of the wordline driver, the first read assist transistor, the second read assist transistor.

* * * * *